US010083764B2

United States Patent
Park et al.

(10) Patent No.: US 10,083,764 B2
(45) Date of Patent: Sep. 25, 2018

(54) MEMORY SYSTEM CAPABLE OF RE-MAPPING ADDRESS

(71) Applicant: SAMSUNG ELECTRONICS CO., LTD., Suwon-si, Gyeonggi-Do (KR)

(72) Inventors: Mi-Kyoung Park, Seoul (KR); Dong-Yang Lee, Yongin-si (KR); Sun-Young Lim, Hwaseong-si (KR); Bu-Il Jung, Hwaseong-si (KR); Ju-Yun Jung, Hwaseong-si (KR); Sung-Ho Cho, Seongnam-si (KR); Hee-Joo Choi, Hwaseong-si (KR); Min-Yeab Choo, Suwon-si (KR); Hyuk Han, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 422 days.

(21) Appl. No.: 14/524,476

(22) Filed: Oct. 27, 2014

(65) Prior Publication Data
US 2015/0199230 A1    Jul. 16, 2015

(30) Foreign Application Priority Data
Jan. 16, 2014  (KR) .................. 10-2014-0001222

(51) Int. Cl.
*G11C 29/00* (2006.01)
*G11C 8/06* (2006.01)
*G11C 29/44* (2006.01)

(52) U.S. Cl.
CPC ............ *G11C 29/76* (2013.01); *G11C 8/06* (2013.01); *G11C 2029/4402* (2013.01)

(58) Field of Classification Search
CPC ............................................. G11C 2029/4402
See application file for complete search history.

(56) References Cited

U.S. PATENT DOCUMENTS 6,081,463 A    6/2000  Shaffer et al.
6,260,156 B1 * 7/2001  Garvin ............... G06F 12/0246
                                                    360/48

(Continued)

FOREIGN PATENT DOCUMENTS

JP        2002-123431           4/2002

*Primary Examiner* — Bryce P Bonzo
*Assistant Examiner* — Katherine Lin
(74) *Attorney, Agent, or Firm* — F. Chau & Associates, LLC

(57) ABSTRACT

A memory system includes a memory controller, a memory cell array, a location information storage unit, an address mapping table, an address conversion unit, and a mapping information calculation unit. The memory controller generates a logical address signal and an address re-mapping command. The memory cell array includes a plurality of logic blocks. The location information storage unit stores location information corresponding to faulty memory cells included in the memory cell array. The address mapping table stores address mapping information. The address conversion unit converts the logical address signal to a physical address signal corresponding to the memory cell array based on the address mapping information. The mapping information calculation unit generates the address mapping information to reduce the number of logic blocks including the faulty memory cells based on the location information upon the mapping information calculation unit receiving the address re-mapping command.

19 Claims, 12 Drawing Sheets

(56) References Cited

U.S. PATENT DOCUMENTS

| | | |
|---|---|---|
| 6,381,708 B1 | 4/2002 | Larsen et al. |
| 6,414,885 B2 | 7/2002 | Nagamatsu et al. |
| 6,728,138 B2 * | 4/2004 | Katayama ............ G11C 16/349 365/185.09 |
| 7,916,540 B2 | 3/2011 | Byeon |
| 7,925,938 B2 | 4/2011 | Hou et al. |
| 8,503,258 B2 | 8/2013 | Keeth et al. |
| 8,520,461 B2 | 8/2013 | Lee et al. |
| 2006/0083085 A1 | 4/2006 | Ikegami |
| 2008/0046677 A1 * | 2/2008 | Maupin ............... G06F 12/0207 711/202 |
| 2008/0191990 A1 | 8/2008 | Matsubara et al. |
| 2010/0269000 A1 | 10/2010 | Lee |
| 2012/0278651 A1 * | 11/2012 | Muralimanohar ...... G06F 11/20 714/6.11 |
| 2014/0115296 A1 * | 4/2014 | Diep ................. G11C 13/0028 711/206 |
| 2015/0187442 A1 * | 7/2015 | Sivasankaran ....... G11C 29/765 365/185.09 |

* cited by examiner

MEMORY SYSTEM CAPABLE OF RE-MAPPING ADDRESS

CROSS-REFERENCE TO RELATED APPLICATIONS

This application claims priority under 35 USC § 119 to Korean Patent Application No. 10-2014-0001222 filed on Jan. 6, 2014, the disclosure of which is incorporated by reference herein in its entirety.

TECHNICAL FIELD

Exemplary embodiments of the present inventive concept relate to a memory system, and more particularly, to a memory system capable of re-mapping addresses based on location information corresponding to faulty memory cells.

DISCUSSION OF THE RELATED ART

A memory cell array in a memory system may include a number of faulty memory cells. When the number of redundant memory cells is equal to or greater than the number of faulty memory cells, the memory cell array may be efficiently repaired. When the number of redundant memory cells is less than the number of faulty memory cells, the memory cell array may not be efficiently repaired.

SUMMARY

Exemplary embodiments of the present inventive concept provide a memory system that increases a normally operating part of a memory cell array including faulty memory cells based on location information corresponding to the faulty memory cells.

According to an exemplary embodiment of the present inventive concept, a memory system includes a memory controller, a first memory cell array, a first location information storage unit, a first address mapping table, a first address conversion unit, and a first mapping information calculation unit. The memory controller is configured to generate a logical address signal and an address re-mapping command. The first memory cell array includes a plurality of first logic blocks. The first location information storage unit is configured to store first location information corresponding to first faulty memory cells included in the first memory cell array. The first address mapping table is configured to store first address mapping information. The first address conversion unit is configured to convert the logical address signal to a first physical address signal corresponding to the first memory cell array based on the first address mapping information. The first mapping information calculation unit is configured to generate the first address mapping information to reduce a number of logic blocks including the first faulty memory cells in the first memory cell array based on the first location information upon the first mapping information calculation unit receiving the address re-mapping command.

In an exemplary embodiment, the first faulty memory cells may be generated during manufacture of the first memory cell array.

In an exemplary embodiment, the first faulty memory cells may be generated during operation of the first memory cell array.

In an exemplary embodiment, the memory system may further include a second memory cell array, a second location information storage unit, a second address mapping table, a second address conversion unit, and a second mapping information calculation unit. The second memory cell array may include a plurality of second logic blocks. The second location information storage unit may be configured to store second location information corresponding to second faulty memory cells included in the second memory cell array. The second address mapping table may be configured to store second address mapping information. The second address conversion unit may be configured to convert the logical address signal to a second physical address signal corresponding to the second memory cell array based on the second address mapping information. The second mapping information calculation unit may be configured to generate the second address mapping information to reduce a number of logic blocks including the second faulty memory cells in the second memory cell array based on the second location information upon the second mapping information calculation unit receiving the address re-mapping command.

In an exemplary embodiment, the memory controller may be configured to transmit divided data signals to the first and second memory cell arrays, respectively. The memory controller may further be configured to receive the divided data signals from the first and second memory cell arrays, respectively.

In an exemplary embodiment, the memory controller may further include a second memory cell array and a second location information storage unit. The second memory cell array may include a plurality of second logic blocks. The second location information storage unit may be configured to store second location information corresponding to second faulty memory cells included in the second memory cell array. The first address mapping table may be configured to store second address mapping information. The first address conversion unit may be configured to convert the logical address signal to a second physical address signal corresponding to the second memory cell array based on the second address mapping information. The first mapping information calculation unit may be configured to generate the second address mapping information to reduce a number of logic blocks including the second faulty memory cells in the second memory cell array based on the second location information upon the first mapping information calculation unit receiving the address re-mapping command.

In an exemplary embodiment, the logical address signal may include a logical row address signal and a logical column address signal. The first physical address signal may include a first physical row address signal and a first physical column address signal.

In an exemplary embodiment, the first address conversion unit may be configured to perform a first address mapping operation based on a first mapping relation between the logical column address signal and the first physical column address signal, and perform a second address mapping operation based on a second mapping relation between the logical row address signal and the first physical row address signal. The first and second mapping relations may be indicated by the first address mapping information.

In an exemplary embodiment, the first mapping information calculation unit may be configured to modify the first mapping relation to reduce the number of logic blocks including the first faulty memory cells.

In an exemplary embodiment, the first mapping information calculation unit may be configured to modify the second mapping relation to reduce the number of logic blocks including the first faulty memory cells.

In an exemplary embodiment, each of the logic blocks may be a page of the first memory cell array.

In an exemplary embodiment, the address re-mapping command may be generated during an initialization process of the memory system.

According to an exemplary embodiment of the present inventive concept, a memory system includes a memory controller, a memory cell array, a first location information storage unit, a second location information storage unit, an address mapping table, an address conversion unit, and a mapping information calculation unit. The memory controller is configured to generate a logical address signal and an address re-mapping command. The memory cell array includes a plurality of logic blocks. The first location information storage unit is configured to store first location information corresponding to first faulty memory cells included in the memory cell array. The first faulty memory cells are generated during manufacture of the memory cell array. The second location information storage unit is configured to store second location information corresponding to second faulty memory cells included in the memory cell array. The second faulty memory cells are generated during operation of the memory cell array. The address mapping table is configured to store address mapping information. The address conversion unit is configured to convert the logical address signal to a physical address signal corresponding to the memory cell array based on the address mapping information. The mapping information calculation unit is configured to generate the address mapping information to reduce a number of logic blocks including the first faulty memory cells in the memory cell array and the second faulty memory cells in the memory cell array based on the first location information and the second location information upon the mapping information calculation unit receiving the address re-mapping command.

In an exemplary embodiment, the logical address signal may include a logical row address signal and a logical column address signal. The physical address signal may include a physical row address signal and a physical column address signal. The address conversion unit may be configured to perform a first address mapping operation based on a first mapping relation between the logical column address signal and the physical column address signal, and perform a second address mapping operation based on a second mapping relation between the logical row address signal and the physical row address. The first and second mapping relations may be indicated by the address mapping information.

In an exemplary embodiment, the mapping information calculation unit may be configured to modify the first mapping relation to reduce the number of logic blocks including the first faulty memory cells and the second faulty memory cells.

In an exemplary embodiment, the mapping information calculation unit may be configured to modify the second mapping relation to reduce the number of logic blocks including the first faulty memory cells and the second faulty memory cells.

According to an exemplary embodiment of the present inventive concept, a method of re-mapping addresses in a memory system includes generating a logical address signal and an address re-mapping command, storing location information corresponding to faulty memory cells included in a memory cell array, storing address mapping information, and converting the logical address signal to a physical address signal corresponding to the memory cell array based on the address mapping information to reduce a number of logic blocks including the faulty memory cells in the memory cell array based on the location information in response to the address re-mapping command.

As described above, a memory system according to an exemplary embodiment of the present inventive concept may increase a normally operating part in a memory cell array and minimize pages including faulty memory cells by re-mapping addresses based on location information corresponding to the faulty memory cells.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
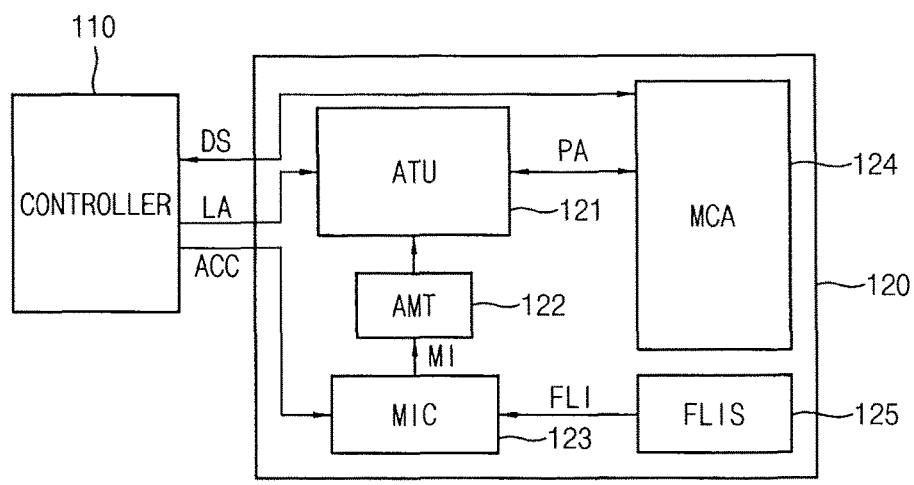
FIG. 1 is a block diagram illustrating a memory system according to an exemplary embodiment of the present inventive concept.

Exemplary embodiments of the present inventive concept will be described more fully hereinafter with reference to the accompanying drawings. Like reference numerals may refer to like elements throughout the accompanying drawings.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. Other words used to describe the relationship between elements should be interpreted in a like fashion (e.g., "between," "adjacent," etc.).

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

FIG. 1 is a block diagram illustrating a memory system according to an exemplary embodiment of the present inventive concept.

Referring to FIG. 1, a memory system 100 includes a memory controller 110 and a memory device 120. The memory device 120 includes a first memory cell array MCA 124, a first location information storage unit FLIS 125, a first address mapping table AMT 122, a first address conversion unit ATU 121, and a first mapping information calculation unit MIC 123. The memory controller 110 generates a logical address signal LA and an address re-mapping command ACC. The first memory cell array 124 includes, for example, a plurality of first logic blocks. The first location information storage unit 125 stores first location information FLI corresponding to first faulty memory cells included in the first memory cell array 124. The first address mapping table 122 stores first address mapping information MI. The first address conversion unit 121 converts the logical address signal LA to a first physical address signal PA corresponding to the first memory cell array 124 based on the first address mapping information MI. The first mapping information calculation unit 123 generates the first address mapping information MI. The first address mapping information MI may be used to reduce the number of logic blocks including the first faulty memory cells based on the first location information FLI corresponding to the first faulty memory cells when the address re-mapping command ACC is received. The memory controller 110 may transmit a data signal DS to the first memory cell array 124. The memory controller 110 may receive the data signal DS from the first memory cell array 124.

The address re-mapping command ACC may be generated during initialization of the memory system 100. The faulty memory cells may be generated, for example, during the manufacture of the first memory cell array 124 or during operation of the first memory cell array 124.

In an exemplary embodiment, the first mapping information calculation unit 123 may generate new address mapping information to increase the lifespan of the memory cells included in the first memory cell array 124, even when the first mapping information calculation unit 123 receives the address re-mapping command ACC and the first location information FLI has no information due to the first memory cell array 124 not including any faulty memory cells. The first address mapping table 122 may store the new address mapping information. The first address conversion unit 121 may convert the logical address signal LA to the first physical address signal PA corresponding to the first memory cell array 124 based on the new address mapping information.

Figure 2A:
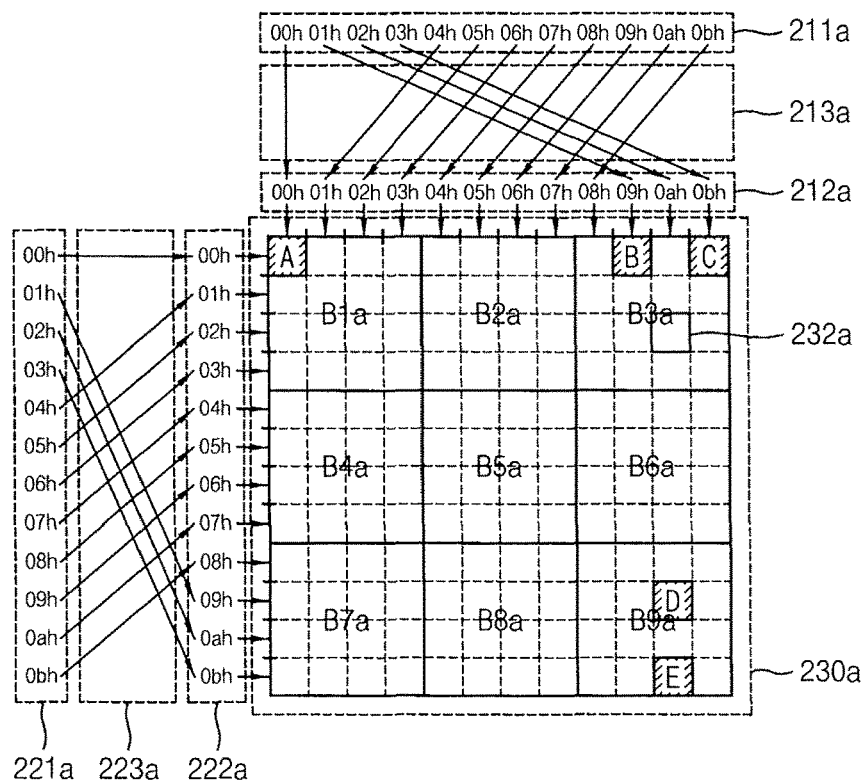
FIGS. 2A and 2B are diagrams illustrating an address re-mapping process of the memory system of FIG. 1 according to an exemplary embodiment of the present inventive concept.
Figure 2B:
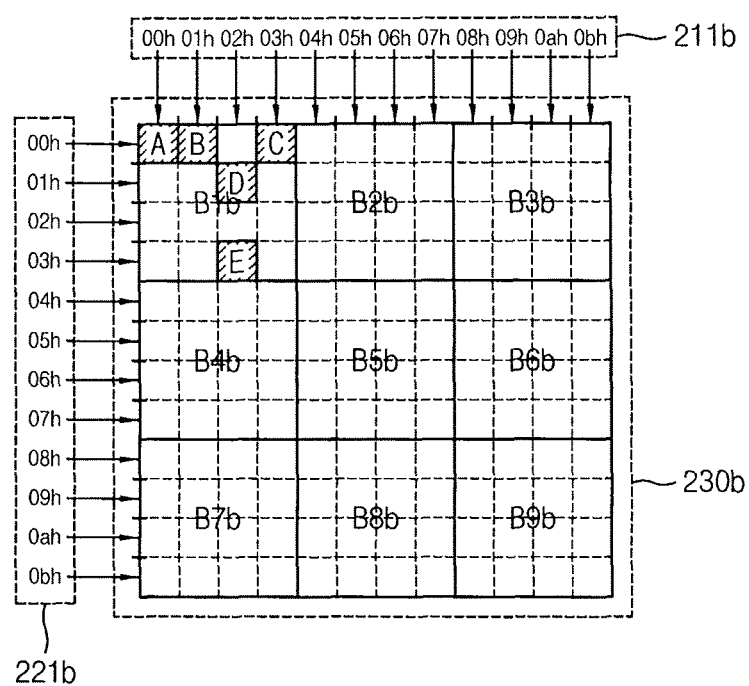

FIGS. 2A and 2B are diagrams illustrating an address re-mapping process of the memory system of FIG. 1 according to an exemplary embodiment of the present inventive concept.

Referring to FIG. 2A, a memory cell array 230a corresponds to the first memory cell array 124 included in the memory system 100 of FIG. 1. The memory cell array 230a shown in FIG. 2A represents the first memory cell array 124 arranged according to the first physical row address values 222a and the first physical column address values 212a.

In an exemplary embodiment, the memory cell array 230a includes 9 logic blocks B1a, B2a, B3a, B4a, B5a, B6a, B7a, B8a, and B9a. The first logic block B1a includes a first faulty memory cell A. The third logic block B3a includes a normal memory cell 232a, a second faulty memory cell B, and a third faulty memory cell C. The ninth logic block B9a includes a fourth faulty memory cell D and a fifth faulty memory cell E. Each of the logic blocks B1a, B2a, B3a, B4a, B5a, B6a, B7a, B8a, and B9a may be, for example, a page of the first memory cell array 124.

The logical address signal LA of the memory system 100 may include a logical column address signal and a logical row address signal, and the first physical address signal PA may include the first physical column address signal and the first physical row address signal.

In an exemplary embodiment, the logical column address signal may have one of address values 211a which are from 00h to 0bh. The first physical column address signal may have one of address values 212a which are from 00h to 0bh. The logical row address signal may have one of address values 221a which are from 00h to 0bh. The first physical row address signal may have one of address values 222a which are from 00h to 0bh. It is to be understood that the address values shown in FIG. 2A are exemplary, and that address values of exemplary embodiments of the present inventive concept are not limited thereto.

The first address mapping information MI may include a first mapping relation 213a between the logical column address signal and the first physical column address signal of the first memory cell array 124. The first address mapping information MI may further include a second mapping relation 223a between the logical row address signal and the first physical row address signal of the first memory cell array 124. The first address conversion unit 121 may perform address mapping operations according to the first mapping relation 213a and the second mapping relation 223a. For example, the first address conversion unit 121 may perform a first address mapping operation based on the first mapping relation 213a, which is indicated by the first address mapping information MI, and perform a second address mapping operation based on the second mapping relation 223a, which is indicated by the first address mapping information MI. In an exemplary embodiment, the first mapping information calculation unit 123 may modify the first and second mapping relations 213a and 223a to reduce the number of logic blocks including faulty memory cells.

In an exemplary embodiment, when the logical column address signal and the first physical column address signal are mapped at a 1:1 ratio and the logical row address signal and the first physical row address signal are mapped at a 1:1 ratio, the first faulty memory cell A is located at (00h, 00h) (e.g., a logical row address value 00h and a logical column address value 00h), the second faulty memory cell B is located at (00h, 09h) (e.g., a logical row address value 00h and a logical column address value 09h), the third faulty memory cell C is located at (00h, 0bh), the fourth faulty memory cell D is located at (09h, 0ah), and the fifth faulty memory cell E is located at (0bh, 0ah). In this case, the first logic block B1a including the first faulty memory cell A, the third logic block B3a including the second faulty memory cell B and the third faulty memory cell C, and the ninth logic block B9a including the fourth faulty memory cell D and the fifth faulty memory cell E cannot be used.

In an exemplary embodiment, the first address conversion unit 121 included in the memory system 100 of FIG. 1 may map addresses between the logical column address signal and the first physical column address signal based on the first address mapping information MI (see 213a in FIG. 2A), and may map addresses between the logical row address signal and the first physical row address signal based on the first address mapping information MI (see 223*a* in FIG. 2A).

For example, referring to the first mapping relation 213*a* in FIG. 2A, the address conversion unit 121 may map a logical column address value 00h to the first physical column address value 00h. The address conversion unit 121 may further map a logical column address value 01h to the first physical column address value 09h. The address conversion unit 121 may further map a logical column address value 02h to the first physical column address value 0ah. The address conversion unit 121 may further map a logical column address value 03h to the first physical column address value 0bh. The address conversion unit 121 may further map a logical column address value 04h to the first physical column address value 01h. The address conversion unit 121 may further map a logical column address value 05h to the first physical column address value 02h. The address conversion unit 121 may further map a logical column address value 06h to the first physical column address value 03h. The address conversion unit 121 may further map a logical column address value 07h to the first physical column address value 04h. The address conversion unit 121 may further map a logical column address value 08h to the first physical column address value 05h. The address conversion unit 121 may further map a logical column address value 09h to the first physical column address value 06h. The address conversion unit 121 may further map a logical column address value 0ah to the first physical column address value 07h. The address conversion unit 121 may further map a logical column address value 0bh to the first physical column address value 08h.

Referring to the second mapping relation 223*a* in FIG. 2A, the address conversion unit 121 may map a logical row address value 00h to the first physical row address value 00h. The address conversion unit 121 may further map a logical row address value 01 h to the first physical row address value 09h. The address conversion unit 121 may further map a logical row address value 02h to the first physical row address value 0ah. The address conversion unit 121 may further map a logical row address value 03h to the first physical row address value 0bh. The address conversion unit 121 may further map a logical row address value 04h to the first physical row address value 01h. The address conversion unit 121 may further map a logical row address value 05h to the first physical row address value 02h. The address conversion unit 121 may further map a logical row address value 06h to the first physical row address value 03h. The address conversion unit 121 may further map a logical row address value 07h to the first physical row address value 04h. The address conversion unit 121 may further map a logical row address value 08h to the first physical row address value 05h. The address conversion unit 121 may further map a logical row address value 09h to the first physical row address value 06h. The address conversion unit 121 may further map a logical row address value 0ah to the first physical row address value 07h. The address conversion unit 121 may further map a logical row address value 0bh to the first physical row address value 08h.

Referring to FIG. 2B, a memory cell array 230*b* corresponds to the first memory cell array 124 arranged according to the logical row address values 221*b* and the logical column address values 211*b*. The memory cell array 230*b* includes 9 logic blocks B1*b*, B2*b*, B3*b*, B4*b*, B5*b*, B6*b*, B7*b*, B8*b*, and B9*b*. The logical column address signal may have one of address values 211*b* which are from 00h to 0bh. The logical row address signal may have one of address values 221*b* which are from 00h to 0bh.

A first faulty memory cell A is located at (00h, 00h) (e.g., a logical row address value 00h and a logical column address value 00h). A second faulty memory cell B is located at (00h, 01h). A third faulty memory cell C is located at (00h, 03h). A fourth faulty memory cell D is located at (01h, 02h). A fifth faulty memory cell E is located at (03h, 02h).

The first logic block B1*b* including the first faulty memory cell A, the second faulty memory cell B, the third faulty memory cell C, the fourth faulty memory cell D, and the fifth faulty memory cell E cannot be used. The logic blocks B2*b*, B3*b*, B4*b*, B5*b*, B6*b*, B7*b*, B8*b*, and B9*b* may be used.

Figure 3A:
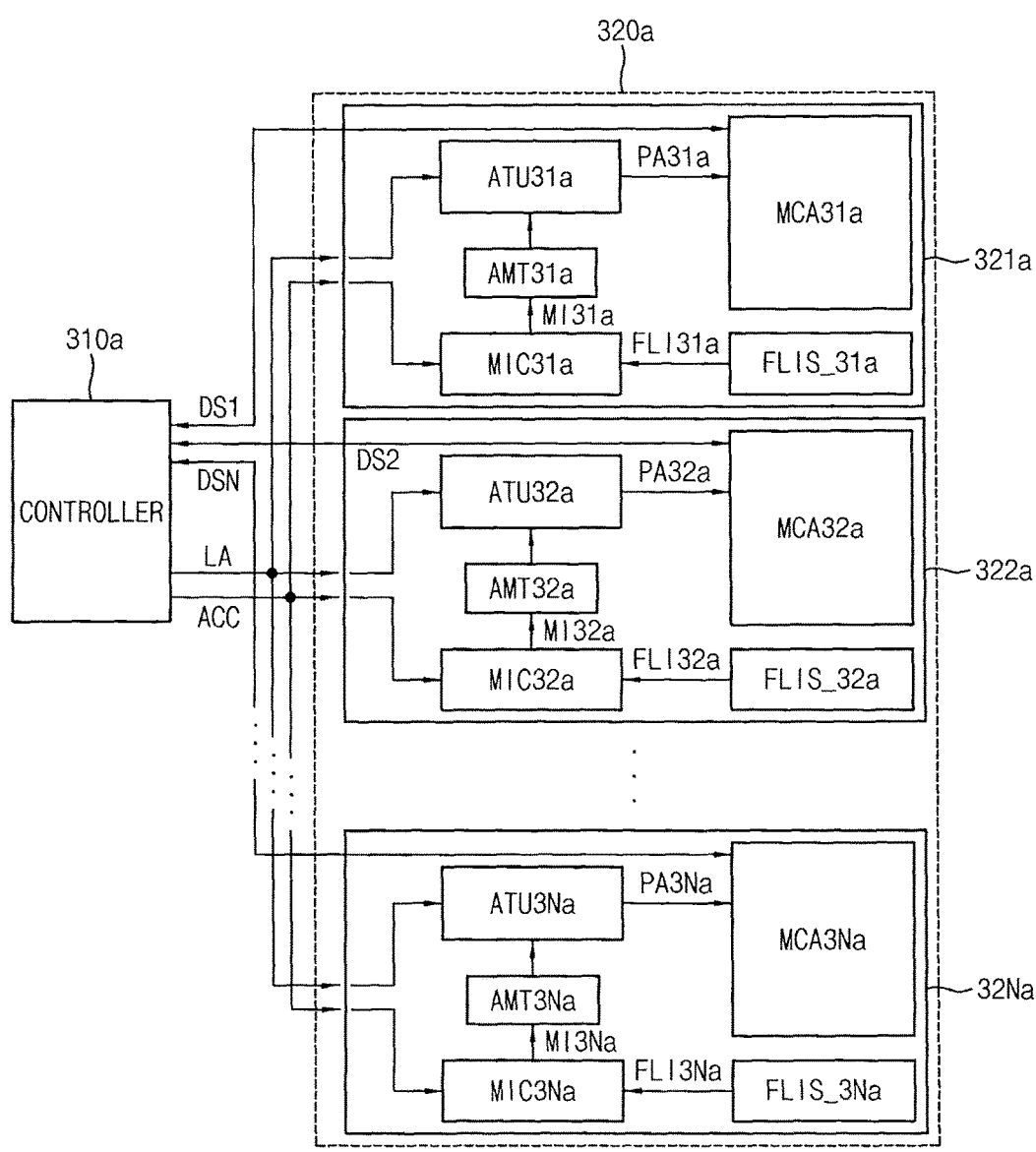
FIGS. 3A and 3B are block diagrams illustrating memory systems according to exemplary embodiments of the present inventive concept.
Figure 3B:
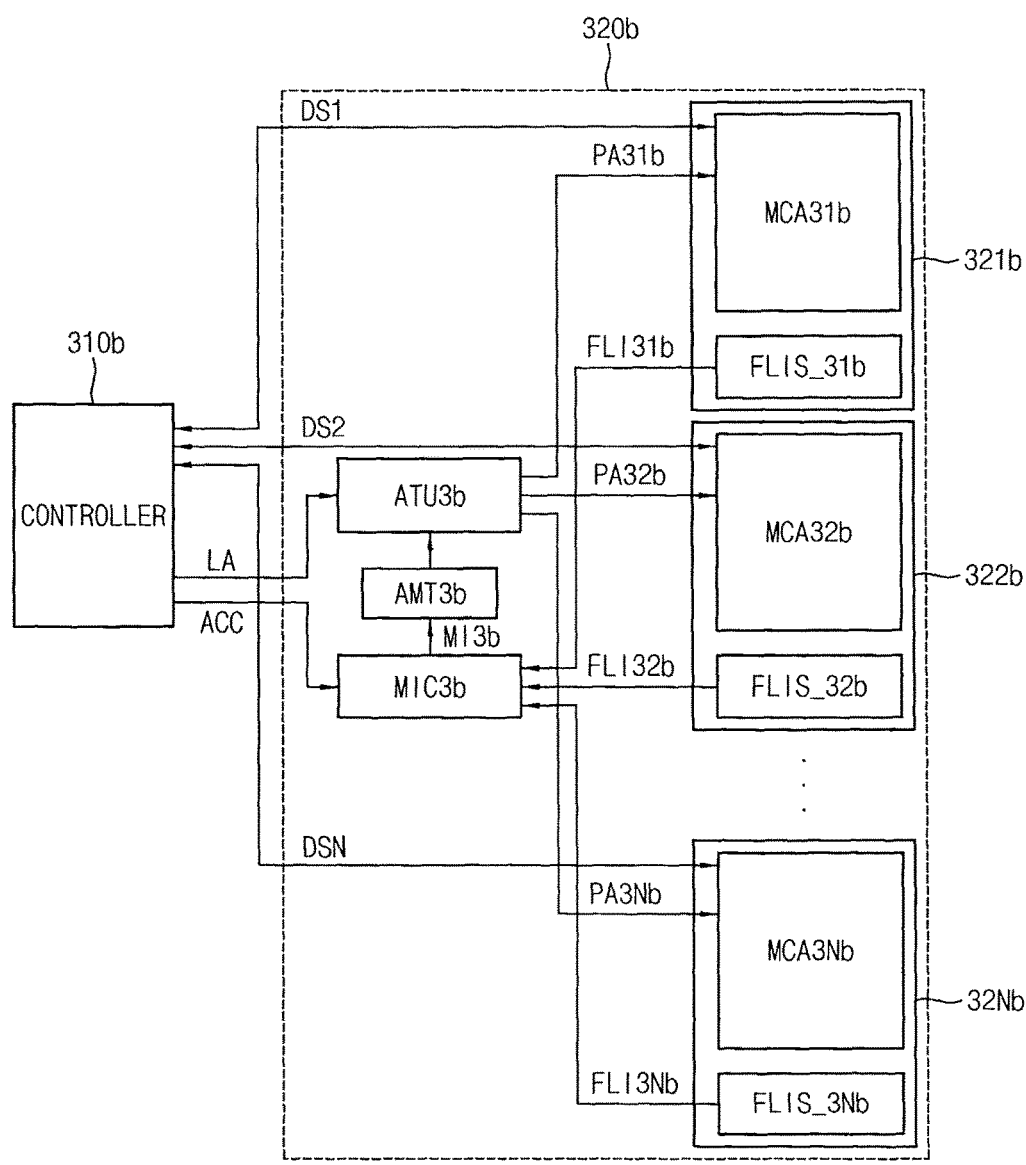

FIGS. 3A and 3B are block diagrams illustrating memory systems according to exemplary embodiments of the present inventive concept.

Referring to FIG. 3A, a memory system 300*a* includes a memory controller 310*a* and a memory device 320*a*. The memory device 320*a* includes a first memory module 321*a* and a second memory module 322*a* through an (N)-th memory module 32Na. The first memory module 321*a* includes a first memory cell array MCA31*a*, a first location information storage unit FLIS_31*a*, a first address mapping table AMT31*a*, a first address conversion unit ATU31*a*, and a first mapping information calculation unit MIC31*a*. The second memory module 322*a* includes a second memory cell array MCA32*a*, a second location information storage unit FLIS_32*a*, a second address mapping table AMT32*a*, a second address conversion unit ATU32*a*, and a second mapping information calculation unit MIC32*a*. The (N)-th memory module 32Na includes an (N)-th memory cell array MCA3Na, an (N)-th location information storage unit FLIS_3Na, an (N)-th address mapping table AMT3Na, an (N)-th address conversion unit ATU3Na, and an (N)-th mapping information calculation unit MIC3Na. The memory controller 310*a* may generate a logical address signal LA and an address re-mapping signal ACC. The memory cell arrays MCA31*a*, MCA32*a*, and MCA3Na each include a plurality of logic blocks.

The first location information storage unit FLIS_31*a* may store first location information FLI31*a* corresponding to first faulty memory cells included in the first memory cell array MCA31*a*. The second location information storage unit FLIS_32*a* may store second location information FLI32*a* corresponding to second faulty memory cells included in the second memory cell array MCA32*a*. The (N)-th location information storage unit FLIS_3Na may store (N)-th location information FLI3Na corresponding to (N)-th faulty memory cells included in the (N)-th memory cell array MCA3Na.

The first address mapping table AMT31*a* may store first address mapping information MI31*a*. The second address mapping table AMT32*a* may store second address mapping information MI32*a*. The (N)-th address mapping table AMT3Na may store (N)-th address mapping information MI3Na.

The first address conversion unit ATU31*a* may convert the logical address signal LA to a first physical address signal PA31*a* corresponding to the first memory cell array MCA31*a*. The second address conversion unit ATU32*a* may convert the logical address signal LA to a second physical address signal PA32*a* corresponding to the second memory cell array MCA32*a*. The (N)-th address conversion unit ATU3Na may convert the logical address signal LA to an (N)-th physical address signal PA3Na corresponding to the (N)-th memory cell array MCA3Na.

The first mapping information calculation unit MIC31*a* may generate the first address mapping information MI31*a* used to reduce the number of logic blocks including the first faulty memory cells based on the first location information FLI31a corresponding to the first faulty memory cells when the address re-mapping command ACC is received. The second mapping information calculation unit MIC32a may generate the second address mapping information MI32a used to reduce the number of logic blocks including the second faulty memory cells based on the second location information FLI32a corresponding to the second faulty memory cells when the address re-mapping command ACC is received. The (N)-th mapping information calculation unit MIC3Na may generate the (N)-th address mapping information MI3Na used to reduce the number of logic blocks including the (N)-th faulty memory cells based on the (N)-th location information FLI3Na corresponding to the (N)-th faulty memory cells when the address re-mapping command ACC is received.

The memory controller 310a may output data signals. The data signals may be divided into, for example, first divided data signals DS1, second divided data signals DS2, and (N)-th divided data signal DSN. In an exemplary embodiment, when the data signals are 24-bit signals (D[23:0]) and N is 3, the first divided data signals DS1 may include the upper 8 bits (D[23:16]), the second divided data signals DS2 may include the middle 8 bits (D[15:8]), and the (N)-th divided data signals DSN may include the lower 8 bits (D[7:0]). In an exemplary embodiment, when the data signals are 24-bit signals (D[23:0]) and N is 3, the first divided data signals DS1 may include the lower 8 bits (D[7:0]), the second divided data signals DS2 may include the middle 8 bits (D[15:8]), and the (N)-th divided data signals DSN may include the upper 8 bits (D[23:16]).

The memory controller 310a may transfer the first divided data signals DS1 to the first memory cell array MCA31a. The memory controller 310a may receive the first divided data signals DS1 from the first memory cell array MCA31a. The memory controller 310a may transfer the second divided data signals DS2 to the second memory cell array MCA32a. The memory controller 310a may receive the second divided data signals DS2 from the second memory cell array MCA32a. The memory controller 310a may transfer the (N)-th divided data signals DSN to the (N)-th memory cell array MCA3Na. The memory controller 310a may receive the (N)-th divided data signals DSN from the (N)-th memory cell array MCA3Na.

Referring to FIG. 3B, a memory system 300b includes a memory controller 310b and a memory device 320b. The memory device 320b includes an address mapping table AMT3b, an address conversion unit ATU3b, a mapping information calculation unit MIC3b, a first memory module 321b, and a second memory module 322b through an (N)-th memory module 32Nb. The first memory module 321b includes a first memory cell array MCA31b and a first location information storage unit FLIS_31b. The second memory module 322b includes a second memory cell array MCA32b and a second location information storage unit FLIS_32b. The (N)-th memory module 32Nb includes an (N)-th memory cell array MCA3Nb and an (N)-th location information storage unit FLIS_3Nb.

The first location information storage unit FLIS_31b may store first location information FLI31b corresponding to the first faulty memory cells included in the first memory cell array MCA31b. The second location information storage unit FLIS_32b may store second location information FLI32b corresponding to the second faulty memory cells included in the second memory cell array MCA32b. The (N)-th location information storage unit FLIS_3Nb may store (N)-th location information FLI3Nb corresponding to the (N)-th faulty memory cells included in the (N)-th memory cell array MCA3Nb.

The address mapping table AMT3b may store address mapping information MI3b. The first address conversion unit ATU3b may convert the logical address signal LA to physical address signals PA31b, PA32b, and PA3Nb corresponding to the memory cell arrays MCA31b, MCA32b, and MCA3Nb, respectively. The mapping information calculation unit MIC3b may generate address mapping information MI3b used to reduce the number of logic blocks including faulty memory cells based on the first location information FLI31b, the second location information FLI32b, and the (N)-th location information FLI3Nb when the address re-mapping command ACC is received.

Data signals may be divided into divided data signals DS1, DS2, and DSN. The memory controller 310b may transmit the divided data signals DS1, DS2, and DSN to the memory cell arrays MCA31b, MCA32b, and MCA3Nb, respectively. The memory controller 310b may receive the divided data signals DS1, DS2, and DSN from the memory cell arrays MCA31b, MCA32b, and MCA3Nb, respectively. In an exemplary embodiment, when the data signals are 24-bit signals (D[23:0]) and N is 3, the first divided data signals DS1 may include the upper 8 bits (D[23:16]), the second divided data signals DS2 may include the middle 8 bits (D[15:8]), and the (N)-th divided data signals DSN may include the lower 8 bits (D[7:0]). In an exemplary embodiment, when the data signals are 24-bit signals (D[23:0]) and N is 3, the first divided data signals DS1 may include the lower 8 bits (D[7:0]), the second divided data signals DS2 may include the middle 8 bits (D[15:8]), and the (N)-th divided data signals DSN may include the upper 8 bits (D[23:16]).

Figure 4A:
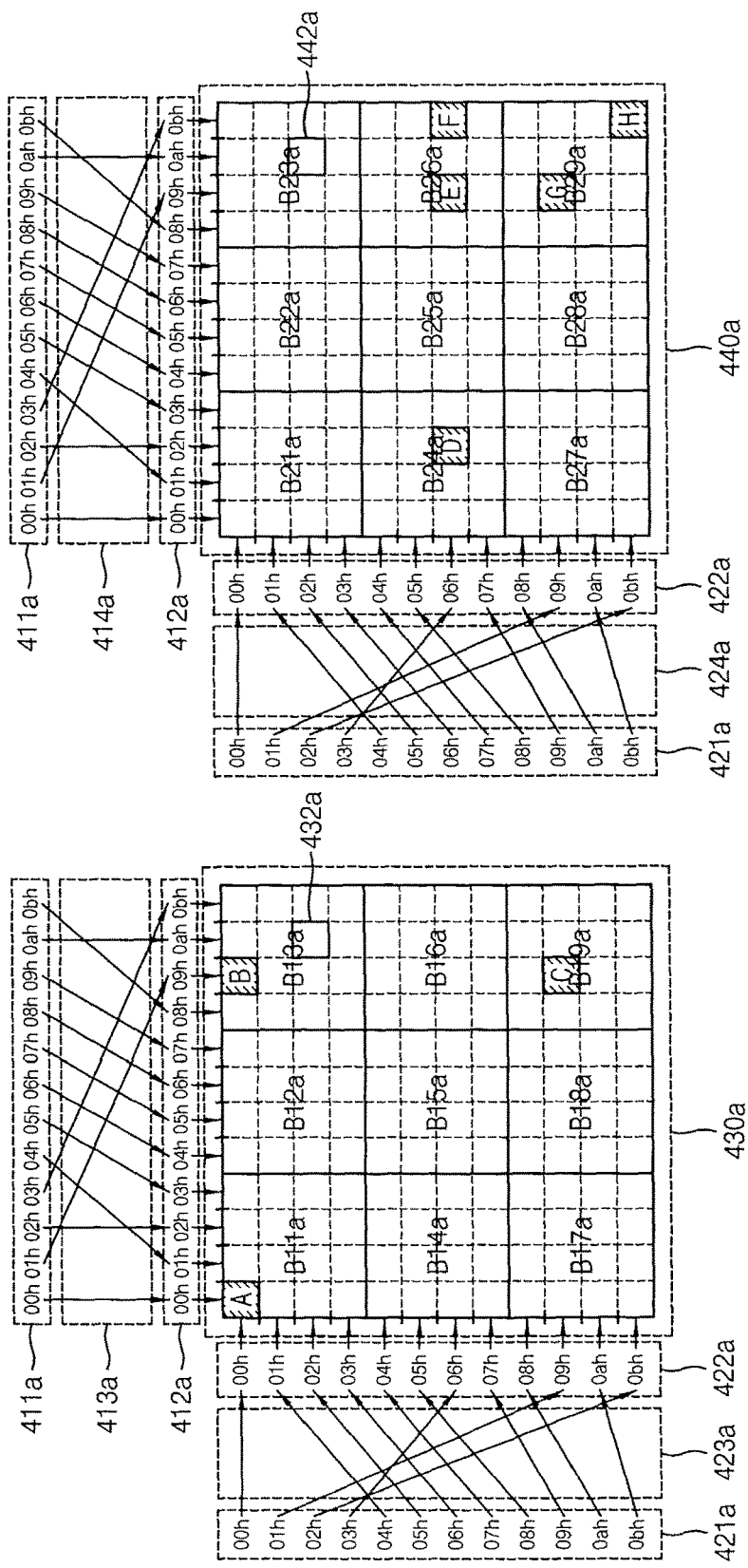
FIGS. 4A and 4B are diagrams illustrating an address re-mapping process of the memory systems of FIGS. 3A and 3B according to exemplary embodiments of the present inventive concept.
Figure 4B:
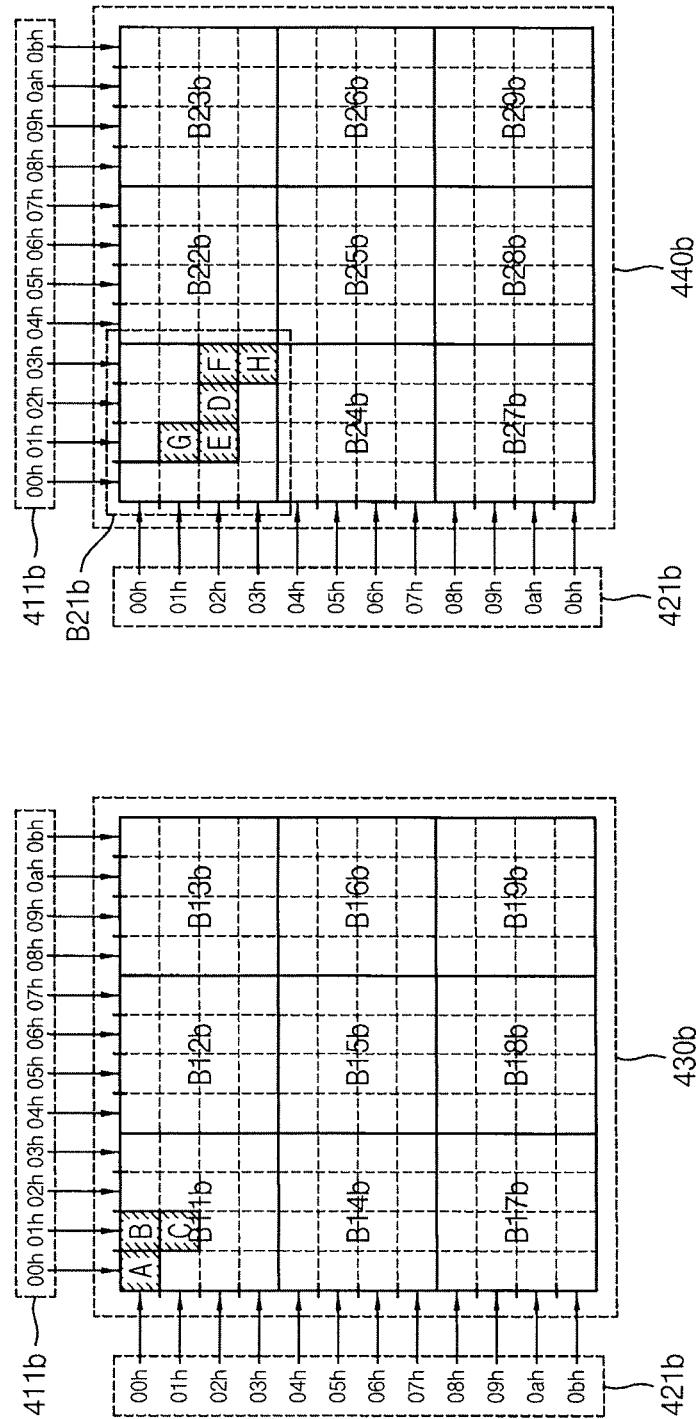

FIGS. 4A and 4B are diagrams illustrating an address re-mapping process of the memory systems of FIGS. 3A and 3B according to exemplary embodiments of the present inventive concept.

FIGS. 4A and 4B illustrate an exemplary scenario in which the memory systems of FIGS. 3A and 3B include two memory modules, respectively. The first memory cell array 430a may correspond to the first memory cell array MCA31a included in the memory system 300a of FIG. 3A or the first memory cell array MCA31b included in the memory system 300b of FIG. 3B. The second memory cell array 440a may correspond to the second memory cell array MCA32a included in the memory system 300a of FIG. 3A or the second memory cell array MCA32b included in the memory system 300b of FIG. 3B.

Data signals corresponding to the logical address signal LA of the memory system 300a of FIG. 3A or data signals corresponding to the logical address signal LA of the memory system 300b of FIG. 3B may be evenly divided into first data signals and second data signals. The first data signals and the second data signals may be stored in the first memory cell array 430a and the second memory array 440a, respectively.

In an exemplary embodiment, when the data signals are 24-bit signals (D[23:0]), the lower 12 bits (D[11:0]) may be stored in a first memory cell 432a and the upper 12 bits (D[23:12]) may be stored in a second memory cell array 442a. In an exemplary embodiment, when the data signals are 24-bit signals (D[23:0]), the upper 12 bits (D[11:0]) may be stored in the first memory cell 432a and the lower 12 bits (D[23:12]) may be stored in the second memory cell array 442a. FIGS. 4A and 4B illustrate an exemplary embodiment in which the upper bits of the data signals are stored in a memory cell included in the first memory cell array 430*a* and the lower bits of the data signals are stored in a memory cell included in the second memory cell array 440*a*.

Referring to FIG. 4A, memory cell arrays 430A and 440A correspond to the memory cell arrays MCA31*a* and MCA32*a* of FIG. 3A or the memory cell arrays MCA31*b* and MCA32*b* of FIG. 3B arranged according to physical row address values 422*a* and physical column address values 412*a*.

The first memory cell array 430*a* may include 9 logic blocks B11*a*, B12*a*, B13*a*, B14*a*, B15*a*, B16*a*, B17*a*, B18*a*, and B19*a*. The second memory cell array 440*a* may includes 9 logic blocks B21*a*, B22*a*, B23*a*, B24*a*, B25*a*, B26*a*, B27*a*, B28*a*, and B29*a*. Logic block B11*a* includes a first faulty memory cell A. Logic block B13*a* includes a second faulty memory cell B. Logic block B19*a* includes a third faulty memory cell C. Logic block B24*a* includes a fourth faulty memory cell D. Logic block B26*a* includes a fifth faulty memory cell E and a sixth faulty memory cell F. Logic block B29*a* includes a seventh faulty memory cell G and an eighth faulty memory cell H.

The logical address signal LA of the memory system 300*a* of FIG. 3A or the logical address signal LA of the memory system 300*b* of FIG. 3B may be a logical column address signal and a logical row address signal. Each of the physical address signals PA31*a* through PA3N*a* of the memory system 300*a* of FIG. 3A or each of the physical address signals PA31*b* through PA3N*b* of the memory system 300*b* of FIG. 3B may include a physical column address signal and a physical row address signal.

In an exemplary embodiment, the logical column address signal of the memory system 300*a* of FIG. 3A or the logical column address signal of the memory system 300*b* of FIG. 3B may have one of address values 411*a* which are from 00h to 0bh. The physical column address signal of the memory system 300*a* of FIG. 3A or the physical column address signal of the memory system 300*b* of FIG. 3B may have one of address values 412*a* which are from 00h to 0bh. The logical row address signal of the memory system 300*a* of FIG. 3A or the logical row address signal of the memory system 300*b* of FIG. 3B may have one of address values 421*a* which are from 00h to 0bh. The physical row address signal of the memory system 300*a* of FIG. 3A or the physical row address signal of the memory system 300*b* of FIG. 3B may have one of address values 422*a* which are from 00h to 0bh.

In an exemplary embodiment, when the logical column address signal and the first physical column address signal of the first memory cell array MCA31*a* or MCA31*b* are mapped at a 1:1 ratio, the logical row address signal and the first physical row address signal of the first memory cell array MCA31*a* or MCA31*b* are mapped at a 1:1 ratio, the logical column address signal and the second physical column address signal of the second memory cell array MCA32*a* or MCA32*b* are mapped at a 1:1 ratio, and the logical row address signal and the second physical row address signal of the second memory cell array MCA32*a* or MCA32*b* are mapped at a 1:1 ratio. The first faulty memory cell A stores high bits of data corresponding to (00h, 00h), the second faulty memory cell B stores high bits of data corresponding to (00h, 09h), the third faulty memory cell C stores high bits of data corresponding to (09h, 09h), the fourth faulty memory cell D stores high bits of data corresponding to (06h, 02h), the fifth faulty memory cell E stores high bits of data corresponding to (06h, 09h), the sixth faulty memory cell F stores high bits of data corresponding to (06h, 0bh), the seventh faulty memory cell G stores high bits of data corresponding to (09h, 09h), and the eighth faulty memory cell H stores high bits of data corresponding to (0bh, 0bh).

In this case, the logic block B11*a* and the logic block B21*a* cannot be used because of the first faulty memory cell A. The logic block B13*a* and the logic block B23*a* cannot be used because of the second faulty memory cell B. The logic block B19*a* and the logic block B29*a* cannot be used because of the third faulty memory cell C, the seventh faulty memory cell G, and the eighth faulty memory cell H. The logic block B14*a* and the logic block B24*a* cannot be used because of the fourth faulty memory cell D. The logic block B16*a* and the logic block B26*a* cannot be used because of the fifth faulty memory cell E and the sixth faulty memory cell F.

In an exemplary embodiment, the first address conversion unit ATU31*a* included in the memory system 300*a* of FIG. 3A may map addresses between the logical column address signal and the first physical column address signal of the first memory cell array MCA31*a* according to a first mapping relation 413*a* based on the first address mapping information MI31*a*. The first address conversion unit ATU31*a* included in the memory system 300*a* of FIG. 3A may map addresses between the logical row address signal and the first physical row address signal of the first memory cell array MCA31*a* according to a second mapping relation 423*a* based on the first address mapping information MI31*a*. The second address conversion unit ATU32*a* included in the memory system 300*a* of FIG. 3A may map addresses between the logical column address signal and the second physical column address signal of the second memory cell array MCA32*a* according to a first mapping relation 414*a* based on the second address mapping information MI32*a*. The second address conversion unit ATU32*a* included in the memory system 300*a* of FIG. 3A may map addresses between the logical row address signal and the second physical row address signal of the second memory cell array MCA32*a* according to a second mapping relation 424*a* based on the second address mapping information MI32*a*.

In an exemplary embodiment, the address conversion unit ATU3*b* included in the memory system 300*b* of FIG. 3B may map addresses between the logical column address signal and the first physical column address signal of the first memory cell array MCA31*b* according to a first mapping relation 413*a* based on the address mapping information MI3*b*. The address conversion unit ATU3*b* included in the memory system 300*b* of FIG. 3B may map addresses between the logical column address signal and the second physical column address signal of the second memory cell array MCA32*b* according to a first mapping relation 414*a* based on the address mapping information MI3*b*. The address conversion unit ATU3*b* included in the memory system 300*b* of FIG. 3B may map addresses between the logical row address signal and the first physical row address signal of the first memory cell array MCA31*b* according to a second mapping relation 423*a* based on the address mapping information MI3*b*. The address conversion unit ATU3*b* included in the memory system 300*b* of FIG. 3B may map addresses between the logical row address signal and the second physical row address signal of the second memory cell array MCA32*b* according to a second mapping relation 424*a* based on the address mapping information MI3*b*.

In the exemplary embodiments described above with reference to FIG. 4A, a logical column address value 00h is mapped to a physical column address value 00h, a logical column address value 01 h is mapped to a physical column address value 09h, a logical column address value 02h is mapped to a physical column address value 02h, a logical column address value 03h is mapped to a physical column address value 0bh, a logical column address value 04h is mapped to a physical column address value 01h, a logical column address value 05h is mapped to a physical column address value 03h, a logical column address value 06h is mapped to a physical column address value 04h, a logical column address value 07h is mapped to a physical column address value 05h, a logical column address value 08h is mapped to a physical column address value 06h, a logical column address value 09h is mapped to a physical column address value 07h, a logical column address value 0ah is mapped to a physical column address value 0ah, and a logical column address value 0bh is mapped to a physical column address value 08h.

In the exemplary embodiments described above with reference to FIG. 4A, a logical row address value 00h is mapped to a physical row address value 00h, a logical row address value 01h is mapped to a physical row address value 09h, a logical row address value 02h is mapped to a physical row address value 0bh, a logical row address value 03h is mapped to a physical row address value 06h, a logical row address value 04h is mapped to a physical row address value 01h, a logical row address value 05h is mapped to a physical row address value 02h, a logical row address value 06h is mapped to a physical row address value 03h, a logical row address value 07h is mapped to a physical row address value 04h, a logical row address value 08h is mapped to a physical row address value 05h, a logical row address value 09h is mapped to a physical row address value 07h, a logical row address value 0ah is mapped to a physical row address value 08h, and a logical row address value 0bh is mapped to a physical row address value 0ah.

Referring to FIG. 4B, memory cell arrays 430b and 440b correspond to the memory cell arrays MCA31a and MCA32a of FIG. 3A or the memory cell arrays MCA31b and MCA32b of FIG. 3B arranged according to logical row address values 421b and logical column address values 411b.

The first memory cell array 430b may include 9 logic blocks B11b, B12b, B13b, B14b, B15b, B16b, B17b, B18b, and B19b. The second memory cell array 440b may includes 9 logic blocks B21b, B22b, B23b, B24b, B25b, B26b, B27b, B28b, and B29b.

In this case, logic block B11b and logic block B21b cannot be used because of faulty memory cells A, B, C, D, E, F, G, and H. Other logic blocks B12b, B22b, B13b, B23b, B14b, B24b, B15b, B25b, B16b, B26b, B17b, B27b, B18b, B28b, B19b, and B29b can be used. In this case, more logic blocks may be used than the case in which logical column address signals and physical column address signals are mapped at a 1:1 ratio, and logical row address signals and physical row address signals are mapped at a 1:1 ratio.

Figure 5:
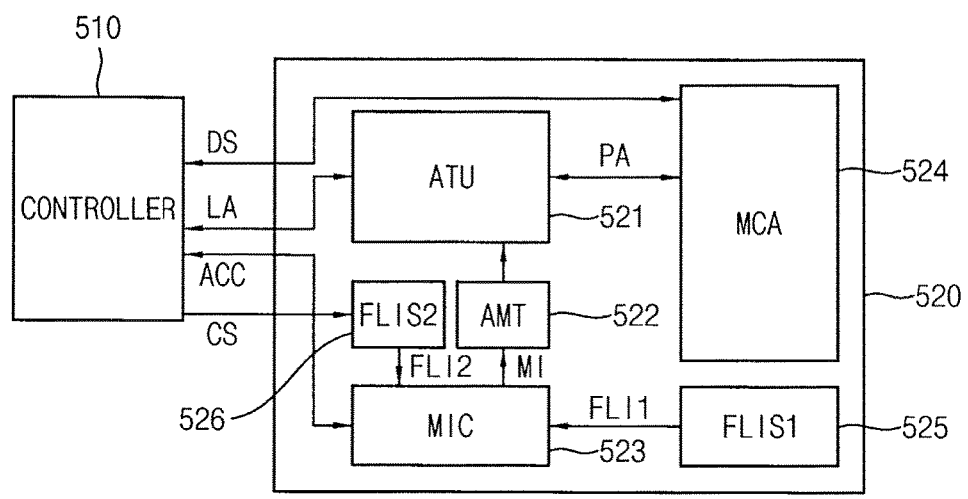
FIGS. 5, 6A and 6B are block diagrams illustrating memory systems according to exemplary embodiments of the present inventive concept.
Figure 6A:
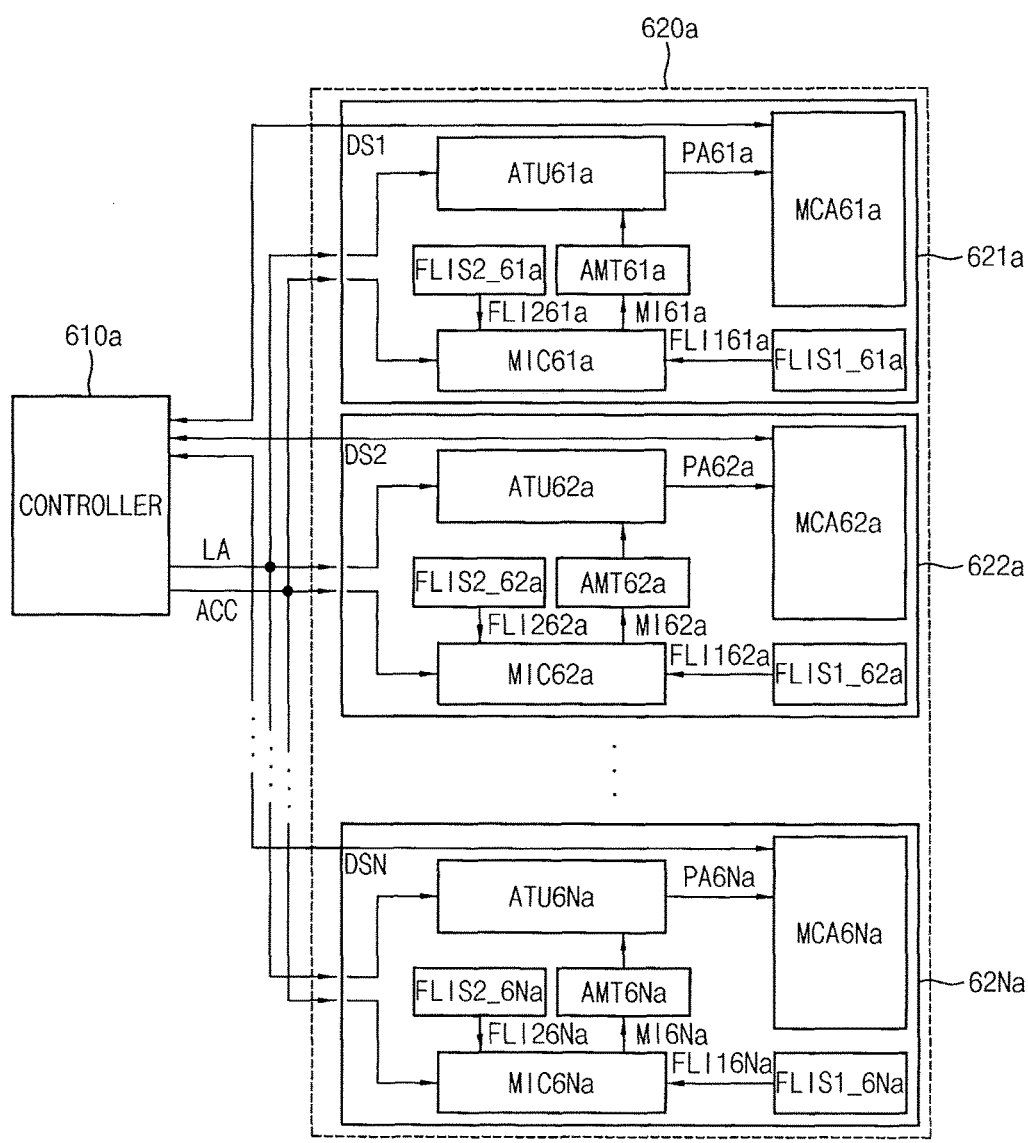
Figure 6B:
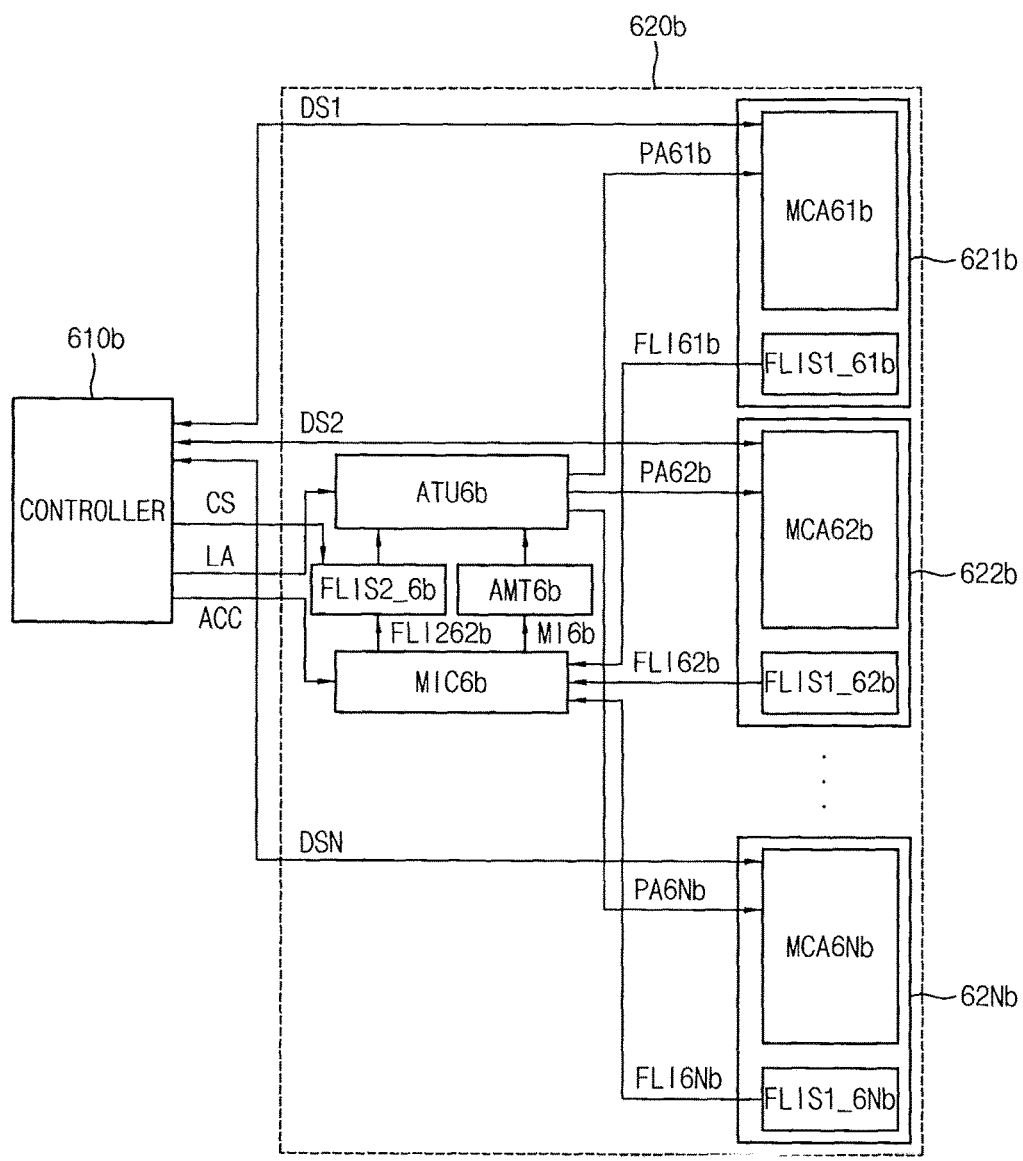

FIGS. 5, 6A and 6B are block diagrams illustrating memory systems according to exemplary embodiments of the present inventive concept.

Referring to FIG. 5, a memory system 500 includes a memory controller 510 and a memory device 520. The memory device 520 includes a memory cell array MCA 524, a first location information storage unit FLIS1 525, a second location information storage unit FLIS2 526, an address mapping table AMT 522, an address conversion unit ATU 521, and a mapping information calculation unit MIC 523. The memory controller 510 may generate a logical address signal LA and an address re-mapping command ACC. The memory cell array 524 includes a plurality of logic blocks.

The first location information storage unit FLIS1 525 stores first location information FLI1 corresponding to first faulty memory cells included in the memory cell array 524. The first faulty memory cells may be generated, for example, during manufacture of the memory cell array 524. The second location information storage unit FLIS2 526 stores second location information FLI2 corresponding to second faulty memory cells included in the memory cell array 524. The second faulty memory cells may be generated, for example, during operation of the memory cell array 524. The address mapping table AMT 522 stores address mapping information MI. The address conversion unit ATU 521 converts the logical address signal LA to a physical address signal PA corresponding to the memory cell array 524 based on the address mapping information MI. The mapping information calculation unit MIC 523 generates the address mapping information MI used to reduce the number of logic blocks including the first faulty memory cells and the second faulty memory cells based on the first location information FLI1 and the second location information FLI2 when the address re-mapping command ACC is received. The memory controller 510 may provide the second location information FLI2 corresponding to the second faulty memory cells to the second location information storage unit FLIS2 526 using the control signal CS.

Referring to FIG. 6A, a memory system 600a includes a memory controller 610a and a memory device 620a. The memory device 620a includes a first memory module 621a and a second memory module 622a through an (N)-th memory module 62Na. The first memory module 621a includes a first memory cell array MCA61a, a location information storage unit FLIS1_61a, a location information storage unit FLIS2_61a, a first address mapping table AMT61a, a first address conversion unit ATU61a, and a first mapping information calculation unit MIC61a. The first address conversion unit ATU61a may convert the logical address signal LA to a first physical address signal PA61a. The second memory module 622a includes a second memory cell array MCA62a, a location information storage unit FLIS1_62a, a location information storage unit FLIS2_62a, a second address mapping table AMT62a, a second address conversion unit ATU62a, and a second mapping information calculation unit MIC62a. The second address conversion unit ATU62a may convert the logical address signal LA to a second physical address signal PA62a. The (N)-th memory module 62Na includes an (N)-th memory cell array MCA6Na, a location information storage unit FLIS 1_6Na, a location information storage unit FLIS2_6Na, an (N)-th address mapping table AMT6Na, an (N)-th address conversion unit ATU6Na, and an (N)-th mapping information calculation unit MIC6Na. The (N)-th address conversion unit ATU6Na may convert the logical address signal LA to an (N)-th physical address signal PA6Na.

The first memory cell array MCA61a may include first faulty memory cells, which may be generated during manufacture of the first memory cell array MCA61a, and second faulty memory cells, which may be generated during operation of the first memory cell array MCA61a. The second memory cell array MCA62a may include third faulty memory cells, which may be generated during manufacture of the second memory cell array MCA62a, and fourth faulty memory cells, which may be generated during operation of the second memory cell array MCA62a. The (N)-th memory cell array MCA6Na may include (N)-th faulty memory cells, which may be generated during manufacture of the (N)-th memory cell array MCA6Na, and (N+1)-th faulty memory cells, which may be generated during operation of the (N)-th memory cell array MCA6Na.

The first mapping information calculation unit MIC61*a* generates the first address mapping information MI61*a* used to reduce the number of logic blocks including the first faulty memory cells and the second faulty memory cells based on first location information FLI161*a* corresponding to the first faulty memory cells and second location information FLI261*a* corresponding to the second faulty memory cells when the address re-mapping command ACC is received. The second mapping information calculation unit MIC62*a* generates the second address mapping information MI62*a* used to reduce the number of logic blocks including the third faulty memory cells and the fourth faulty memory cells based on third location information FLI162*a* corresponding to the third faulty memory cells and fourth location information FLI262*a* corresponding to the fourth faulty memory cells when the address re-mapping command ACC is received. The (N)-th mapping information calculation unit MIC6Na generates the (N)-th address mapping information MI6Na used to reduce the number of logic blocks including the (N)-th faulty memory cells and the (N+1)-th faulty memory cells based on (N)-th location information FLI16Na corresponding to the (N)-th faulty memory cells and (N+1)-th location information FLI26Na corresponding to the (N+1)-th faulty memory cells when the address re-mapping command ACC is received.

Referring to FIG. 6B, a memory system 600*b* includes a memory controller 610*b* and a memory device 620*b*. The memory device 620*b* includes an address mapping table AMT6*b*, an address conversion unit ATU6*b*, a second location information storage unit FLIS2_6*b*, a mapping information calculation unit MIC6*b*, a first memory module 621*b*, and a second memory module 622*b* through an (N)-th memory module 62Nb. The address conversion unit ATU6*b* may convert the logical address signal LA to a first physical address signal PA61*b* and a second physical address signal PA62*b* through an (N)-th physical address signal PA6Nb. The first memory module 621*b* includes a first memory cell array MCA61*b* and a location information storage unit FLIS1_61*b*. The location information storage unit FLIS1_61*b* may store location information FLI61*b*. The second memory module 622*b* includes a second memory cell array MCA62*b* and a location information storage unit FLIS1_62*b*. The location information storage unit FLIS1_62*b* may store location information FLI62*b*. The (N)-th memory module 62Nb includes an (N)-th memory cell array MCA6Nb and a location information storage unit FLIS1_6Nb. The location information storage unit FLIS1_6Nb may store location information FLI6Nb.

The second location information storage unit FLIS2_6*b* stores location information FLI262*b*. The location information FLI262*b* includes first location information corresponding to first faulty memory cells, second location information corresponding to second faulty memory cells, and (N)-th location information corresponding to (N)-th faulty memory cells. The first faulty memory cells may be generated during, for example, operation of the first memory cell array MCA61*b*. The second faulty memory cells may be generated during, for example, operation of the second memory cell array MCA62*b*. The (N)-th faulty memory cells may be generated during, for example, operation of the (N)-th memory cell array MCA6Nb.

The mapping information calculation unit MIC6*b* generates the address mapping information MI6*b* used to reduce the number of logic blocks including faulty memory cells based on the location information FLI262*b* when the address re-mapping command ACC is received.

Figure 7:
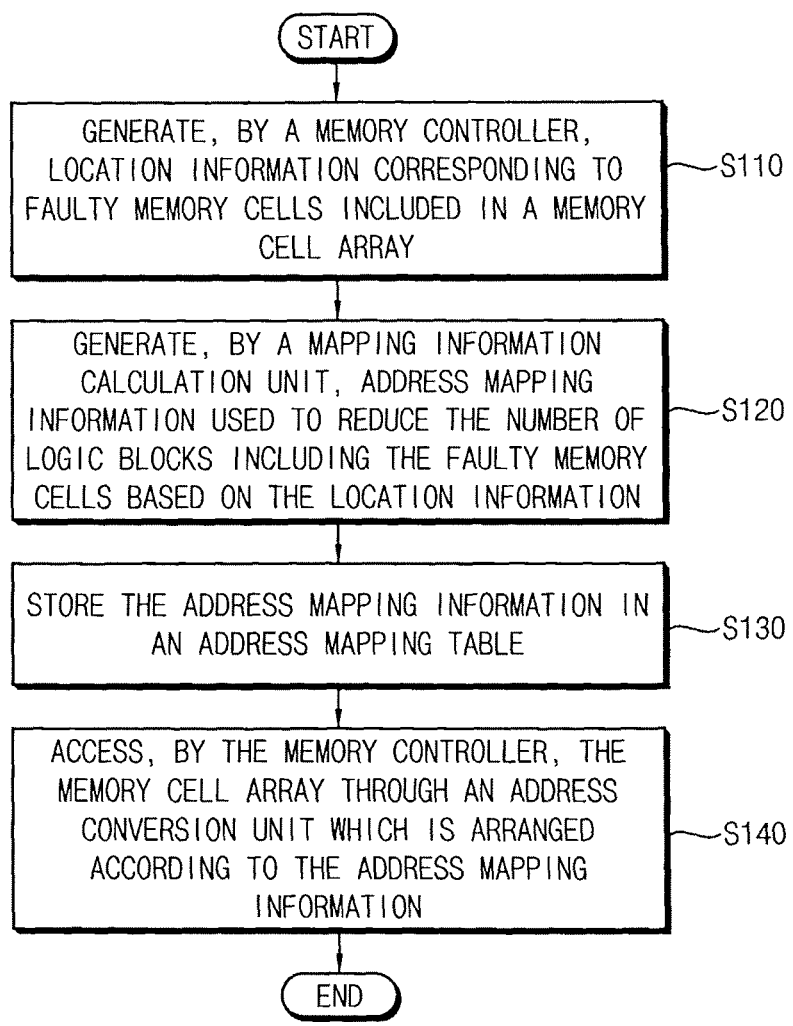
FIG. 7 is a flowchart illustrating an address re-mapping process of a memory system according to an exemplary embodiment of the present inventive concept.

FIG. 7 is a flowchart illustrating an address re-mapping process of a memory system according to an exemplary embodiment of the present inventive concept.

Referring to FIG. 7, to re-map an address of a memory system, location information corresponding to faulty memory cells included in a memory cell array is generated by a memory controller at S110. Address mapping information used to reduce the number of logic blocks including the faulty memory cells based on the location information is generated at S120 by a mapping information calculation unit. The address mapping information is stored in an address mapping table at S130. The memory controller accesses the memory cell array through an address conversion unit which is arranged according to the address mapping information at S140.

According to exemplary embodiments of the present inventive concept, as described herein, a method of re-mapping addresses in a memory system (e.g., the memory system shown in FIGS. 1, 3A, 3B, 5, 6A, and 6B) includes generating a logical address signal and an address re-mapping command, storing location information corresponding to faulty memory cells included in a memory cell array, storing address mapping information, and converting the logical address signal to a physical address signal corresponding to the memory cell array based on the address mapping information. The number of logic blocks including the faulty memory cells in the memory cell array may be reduced based on the location information in response to the address re-mapping command.

Figure 8:
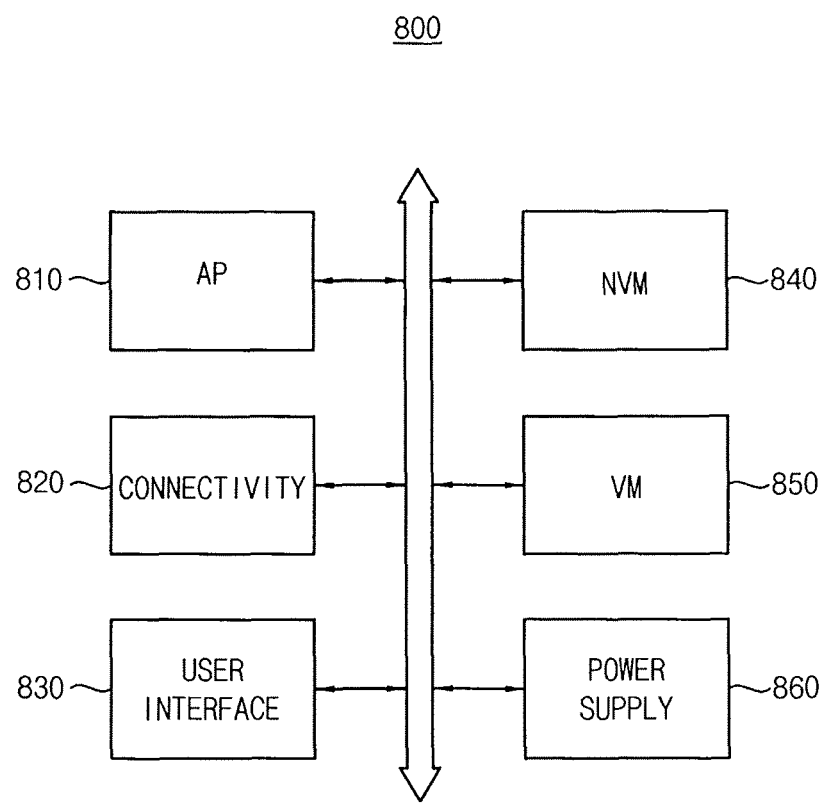
FIG. 8 is a block diagram illustrating a mobile system including a memory system according to an exemplary embodiment of the present inventive concept.

FIG. 8 is a block diagram illustrating a mobile system including a memory system according to an exemplary embodiment of the present inventive concept.

Referring to FIG. 8, a mobile system 800 includes an application processor 810, a connectivity unit 820, a semiconductor memory device 850 (e.g., a volatile memory device), a nonvolatile memory device 840, a user interface 830, and a power supply 860. In exemplary embodiments, the mobile system 800 may be, for example, a mobile phone, a smartphone, a personal digital assistant (PDA), a portable multimedia player (PMP), a digital camera, a music player, a portable game console, a navigation system, etc.

The application processor 810 may execute applications such as, for example, a web browser, a game application, a video player, etc. In exemplary embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity unit 820 may perform wired or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In exemplary embodiments, the connectivity unit 820 may include a baseband chipset that supports communications such as, for example, global system for mobile communications (GSM), general packet radio service (GPRS), wideband code division multiple access (WCDMA), high speed downlink/uplink packet access (HSxPA), etc.

The semiconductor memory device 850 may store data processed by the application processor 810, or may operate as a working memory. For example, the semiconductor memory device 850 may be a dynamic random access memory, such as double data rate synchronous dynamic random-access memory (DDR SDRAM), low power DDR SDRAM (LPDDR SDRAM), graphics double data rate DDR SDRAM (GDDR SDRAM), Rambus DRAM (RDRAM), etc., or may be any volatile memory device that requires a refresh operation. The semiconductor memory device 850 may be a memory device included in the memory systems shown in FIGS. 1, 3A, 3B, 5, 6A, and 6B. The application processor 810 may be the memory controller included in the memory systems of FIGS. 1, 3A, 3B, 5, 6A, and 6B.

The nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device such as, for example, a keypad, a touch screen, etc., and at least one output device such as, for example, a speaker, a display device, etc. The power supply 860 may supply a power supply voltage to the mobile system 800. In exemplary embodiments, the mobile system 800 may further include, for example, a camera image processor (CIS) and/or a storage device, such as a memory card, a solid state drive (SSD), a hard disk drive (HDD), a CD-ROM, etc.

In exemplary embodiments, the mobile system 800 and/or components of the mobile system 800 may be packaged in various forms such as, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 9:
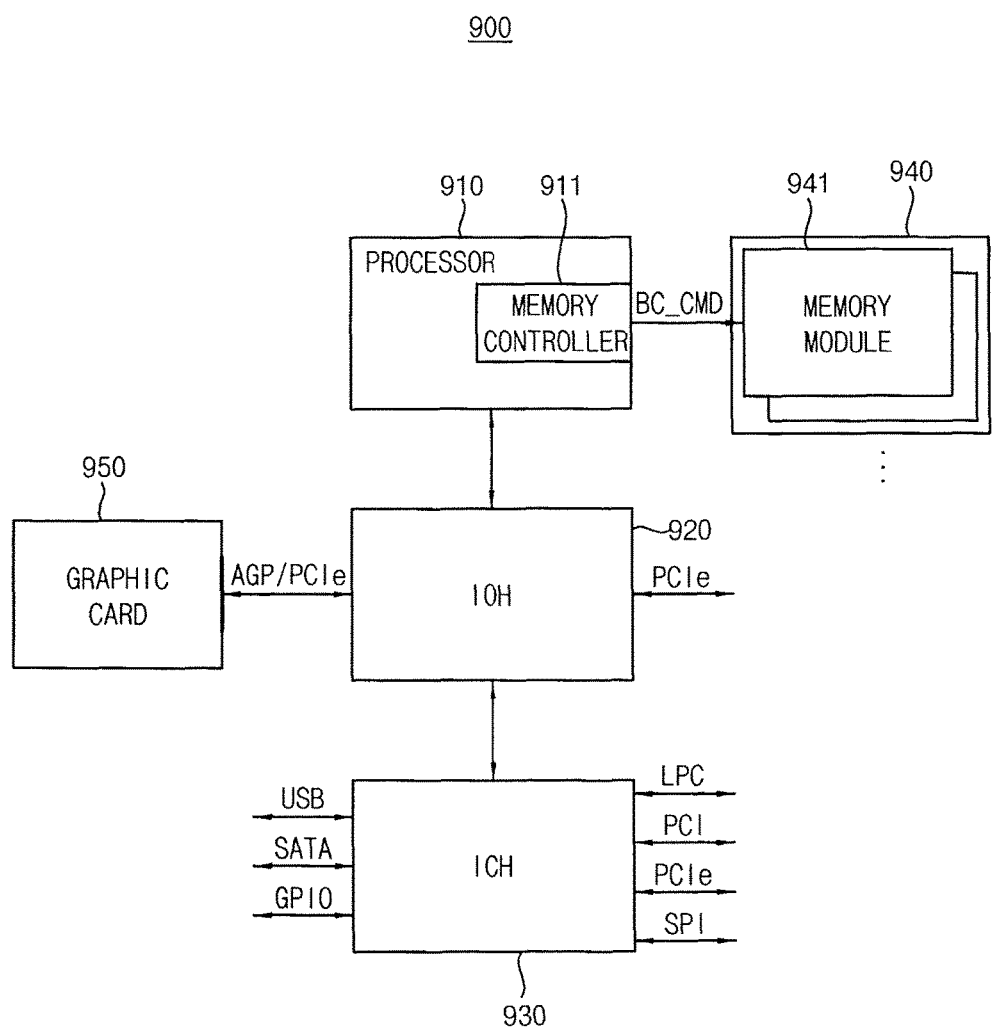
FIG. 9 is a block diagram illustrating a computing system including a memory system according to an exemplary embodiment of the present inventive concept.

FIG. 9 is a block diagram illustrating a computing system including a memory system according to an exemplary embodiment of the present inventive concept.

Referring to FIG. 9, a computing system 900 includes a processor 910, an input/output hub (IOH) 920, an input/output controller hub (ICH) 930, a memory device 940, and a graphics card 950. In exemplary embodiments, the computing system 900 may be, for example, a personal computer (PC), a server computer, a workstation, a laptop computer, a mobile phone, a smartphone, a personal digital assistant (PDA), a portable multimedia player (PMP), a digital camera, a digital television, a set-top box, a music player, a portable game console, a navigation system, etc.

The processor 910 may perform various computing functions such as, for example, executing specific software for performing specific calculations or tasks. For example, the processor 910 may be a microprocessor, a central process unit (CPU), a digital signal processor, etc. In exemplary embodiments, the processor 910 may include a single core or multiple cores. For example, the processor 910 may be a multi-core processor, such as a dual-core processor, a quad-core processor, a hexa-core processor, etc. Although FIG. 9 illustrates the computing system 900 including one processor 910, in exemplary embodiments, the computing system 900 may include a plurality of processors. The processor 910 may include an internal or external cache memory.

The processor 910 may include a memory controller 911 for controlling operations of the memory device 940 via a control signal BC_CMD. The memory controller 911 may be the memory controller included in the memory systems of FIGS. 1, 3A, 3B, 5, 6A, and 6B. The memory controller 911 included in the processor 910 may be referred to as an integrated memory controller (IMC). The memory controller 911 may include the structure and/or perform the methods of one or more of the exemplary embodiments described herein. A memory interface between the memory controller 911 and the memory device 940 may be implemented with a single channel including a plurality of signal lines, or may bay be implemented with multiple channels, to each of which the memory device 940 may be coupled.

The memory device 940 may include one or more memory modules 941 storing data provided from the memory controller. The memory device 940 may be the memory device included in the memory systems of FIGS. 1, 3A, 3B, 5, 6A, and 6B.

The input/output hub 920 may manage data transfer between the processor 910 and devices such as, for example, the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. Although FIG. 9 illustrates the computing system 900 including one input/output hub 920, in exemplary embodiments, the computing system 900 may include a plurality of input/output hubs. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc.

The graphics card 950 may be coupled to the input/output hub 920 via, for example, AGP or PCIe. The graphics card 950 may control a display device for displaying an image. The graphics card 950 may include an internal processor for processing image data and an internal memory device. In exemplary embodiments, the input/output hub 920 may include an internal graphics device along with or instead of the graphics card 950. The graphics device included in the input/output hub 920 may be referred to as an integrated graphics device. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc. The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In exemplary embodiments, the processor 910, the input/output hub 920 and the input/output controller hub 930 may be implemented as separate chipsets or separate integrated circuits. In exemplary embodiments, at least two of the processor 910, the input/output hub 920, and the input/output controller hub 930 may be implemented as a single chipset.

The exemplary embodiments described herein may be applied to a system using a semiconductor memory device. Therefore, the exemplary embodiments may be used in any device or system including a nonvolatile memory device such as, for example, a mobile phone, a smartphone, a PDA, a PMP, a digital camera, a digital television, a set-top box, a music player, a portable game console, a navigation device, a PC, a server computer, a workstation, a tablet computer, a laptop computer, a smart card, a printer, etc.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A memory system, comprising:
   a memory controller configured to generate a logical address signal and an address re-mapping command;
   a first memory cell array comprising a plurality of first logic blocks, wherein each first logic block comprises a sub-array of memory cells arranged in rows and columns;
   a first location information storage unit configured to store first location information corresponding to first faulty memory cells included in the first memory cell array;
   a first address mapping table configured to store first address mapping information;
   a first address conversion unit configured to convert the logical address signal to a first physical address signal corresponding to the first memory cell array based on the first address mapping information; and
   a first mapping information calculation unit configured to generate the first address mapping information based on the first location information,
   wherein the first address conversion unit is configured to reduce a number of first logic blocks including the first faulty memory cells in the first memory cell array by mapping logical column address values to physical column address values, and logical row address values to physical row address values using the first address mapping information upon the first mapping information calculation unit receiving the address re-mapping command,
   wherein reducing the number of first logic blocks including the first faulty memory cells comprises moving all of the first faulty memory cells included in the first memory cell array from at least two of the first logic blocks to a single one of the first logic blocks.

2. The memory system of claim 1, wherein the first faulty memory cells are generated during manufacture of the first memory cell array.

3. The memory system of claim 1, wherein the first faulty memory cells are generated during operation of the first memory cell array.

4. The memory system of claim 1, wherein the memory system further comprises:
   a second memory cell array comprising a plurality of second logic blocks;
   a second location information storage unit configured to store second location information corresponding to second faulty memory cells included in the second memory cell array;
   a second address mapping table configured to store second address mapping information;
   a second address conversion unit configured to convert the logical address signal to a second physical address signal corresponding to the second memory cell array based on the second address mapping information; and
   a second mapping information calculation unit configured to generate the second address mapping information to reduce a number of logic blocks including the second faulty memory cells in the second memory cell array based on the second location information upon the second mapping information calculation unit receiving the address re-mapping command.

5. The memory system of claim 4, wherein the memory controller is configured to transmit divided data signals to the first and second memory cell arrays, respectively, upon the divided data signals being written to the first and second memory cell arrays, and the memory controller is configured to receive the divided data signals from the first and second memory cell arrays, respectively, upon the divided data signals being read from the first and second memory cell arrays.

6. The memory system of claim 1, further comprising:
   a second memory cell array comprising a plurality of second logic blocks; and
   a second location information storage unit configured to store second location information corresponding to second faulty memory cells included in the second memory cell array,
   wherein the first address mapping table is configured to store second address mapping information, the first address conversion unit is configured to convert the logical address signal to a second physical address signal corresponding to the second memory cell array based on the second address mapping information, and the first mapping information calculation unit is configured to generate the second address mapping information to reduce a number of logic blocks including the second faulty memory cells in the second memory cell array based on the second location information upon the first mapping information calculation unit receiving the address re-mapping command.

7. The memory system of claim 1, wherein the logical address signal comprises a logical row address signal and a logical column address signal, and the first physical address signal comprises a first physical row address signal and a first physical column address signal.

8. The memory system of claim 7, wherein the first address conversion unit is configured to perform a first address mapping operation based on a first mapping relation between the logical column address signal and the first physical column address signal, and perform a second address mapping operation based on a second mapping relation between the logical row address signal and the first physical row address signal,
   wherein the first and second mapping relations arc indicated by the first address mapping information.

9. The memory system of claim 8, wherein the first mapping information calculation unit is configured to modify the first mapping relation to reduce the number of logic blocks including the first faulty memory cells.

10. The memory system of claim 8, wherein the first mapping information calculation unit is configured to modify the second mapping relation to reduce the number of logic blocks including the first faulty memory cells.

11. The memory system of claim 1, wherein each of the plurality of first logic blocks is a page of the first memory cell array.

12. The memory system of claim 1, wherein the address re-mapping command is generated during an initialization process of the memory system.

13. A semiconductor memory device, comprising:
a memory cell array comprising a plurality of logic blocks;
a first location information storage unit configured to store first location information corresponding to first faulty memory cells included in the memory cell array, wherein the first faulty memory cells are generated during manufacture of the memory cell array;
a second location information storage unit, separate from the first location information storage unit, configured to store second location information corresponding to second faulty memory cells included in the memory cell array, wherein the second faulty memory cells are generated during operation of the memory cell array;
an address mapping table configured to store address mapping information;
an address conversion unit configured to convert a logical address signal to a physical address signal corresponding to the memory cell array based on the address mapping information, wherein the logical address signal is received from an external device; and
a mapping information calculation unit configured to generate the address mapping information to reduce a number of logic blocks including the first faulty memory cells in the memory cell array and the second faulty memory cells in the memory cell array based on the first location information and the second location information upon the mapping information calculation unit receiving an address re-mapping command received from the external device,
wherein reducing the number of logic blocks including the first faulty memory cells comprises moving all of the first faulty memory cells included in the memory cell array from at least two of the logic blocks to a single one of the logic blocks.

14. The semiconductor memory device, of claim 13, wherein the logical address signal comprises a logical row address signal and a logical column address signal, and the physical address signal comprises a physical row address signal and a physical column address signal,
wherein the address conversion unit is configured to perform a first address mapping operation based on a first mapping relation between the logical column address signal and the physical column address signal, and perform a second address mapping operation based on a second mapping relation between the logical row address signal and the physical row address,
wherein the first and second mapping relations are indicated by the address mapping information.

15. The semiconductor memory device of claim 14, wherein the mapping information calculation unit is configured to modify the first mapping relation to reduce the number of logic blocks including the first faulty memory cells and the second faulty memory cells.

16. The semiconductor memory device of claim 14, wherein the mapping information calculation unit is configured to modify the second mapping relation to reduce the number of logic blocks including the first faulty memory cells and the second faulty memory cells.

17. A method of re-mapping addresses in a semiconductor memory device, the method comprising:
storing location information corresponding to faulty memory cells included in a memory cell array, wherein the memory cell array comprises a plurality of logic blocks, and each logic block comprises a stab-array of memory cells arranged in rows and columns;
storing address mapping information, wherein the address mapping information is based on the location information; and
reducing a number of logic blocks including the faulty memory cells in the memory cell array by mapping logical column address values to physical column address values, and logical row address values to physical row address values using the address mapping information in response to an address re-mapping command received from an external device, wherein the logical column address values and the logical row address values are included in a logical address signal provided from the external device,
wherein reducing the number of logic blocks including the faulty memory cells comprises moving all of the faulty memory cells included in the memory cell array from at least two of the logic blocks to a single one of the logic blocks.

18. The method of claim 17, wherein the faulty memory cells are generated during manufacture of the memory cell array.

19. The method of claim 17, wherein the faulty memory cells are generated during operation of the memory cell array.

* * * * *